United States Patent [19]

Mizohata et al.

[11] Patent Number: 4,710,696
[45] Date of Patent: Dec. 1, 1987

[54] CONTROL DEVICE FOR CONTROLLABLE ELECTRIC VALVE

[75] Inventors: Fumio Mizohata; Takao Kawabata, both of Hyogo, Japan

[73] Assignee: Mitsubishi Denki Kabushiki Kaisha, Tokyo, Japan

[21] Appl. No.: 919,056

[22] Filed: Oct. 15, 1986

[30] Foreign Application Priority Data

Oct. 16, 1985 [JP] Japan .................. 60-228765

[51] Int. Cl.⁴ .............................. G05F 1/613
[52] U.S. Cl. .................... 323/223; 323/351
[58] Field of Search ............ 307/253, 296 R, 297; 323/223, 351

[56] References Cited

U.S. PATENT DOCUMENTS 3,930,170  12/1975  Buren et al. ............... 307/296
4,087,703   5/1978  Akamatsu .................. 307/253
4,287,434   9/1981  Akamatsu .................. 307/253
4,593,204   6/1986  McMurray ................. 307/253

OTHER PUBLICATIONS

M. Akamatsu et al., "Ultrasonic-Frequency-PWM Inverter using Capable Bipolar Transistor and a New PWM Control Method", 1983, pp. 1108–1118.

Yoichi Okano et al., "High Frequency Inverter Using Power Mosfet", 1983, pp. 1119–1129.

Enrico Dallago et al., "Application of Power Mosfets in a Three Phase Inverter Controlled by Microprocessor", 1983, pp. 1142–1149.

Primary Examiner—Patrick R. Salce
Assistant Examiner—Jeffray Starratt
Attorney, Agent, or Firm—Bernard, Rothwell & Brown

[57] ABSTRACT

A device for supplying a control terminal of a three-terminal controllable electric valve connected between positive and negative lines. The device includes a transformer having a primary and a secondary windings, a first capacitor connected to the primary winding, and a second capacitor connected with the secondary winding. The first capacitor is adapted to be charged when the electric valve is turned off and to discharge through the primary winding when the electric valve is turned on. The current induced in the secondary winding by the discharging current is supplied, as an operating current, to the circuit for driving the electric valve.

13 Claims, 12 Drawing Figures

ANODE – CATHODE VOLTAGE IN THREE-TERMINAL CONTROLLABLE ELECTRIC VALVE

FIRST CAPACITOR CURRENT

SECOND CAPACITOR VOLTAGE

FIRST CAPACITOR CURRENT (IN FIG. 7)

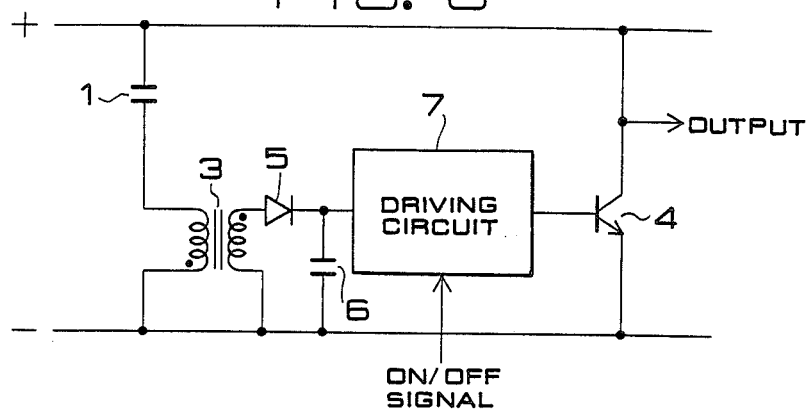
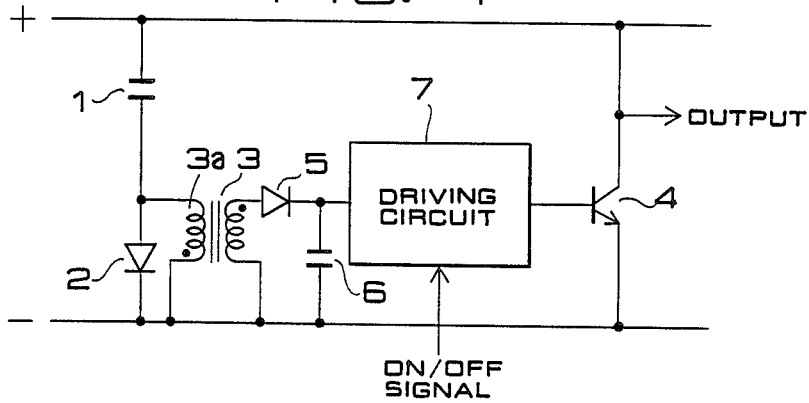
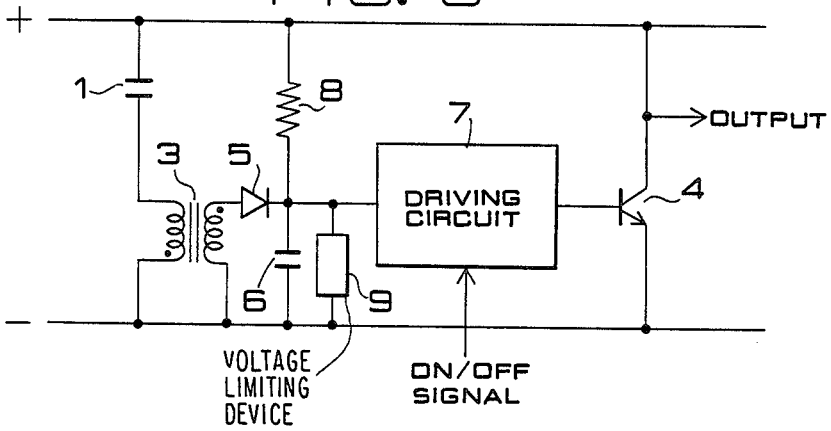

CONTROL DEVICE FOR CONTROLLABLE ELECTRIC VALVE

BACKGROUND OF THE INVENTION

1. Field of the Invention

The present invention relates to a control device for a three-terminal controllable electric valve such as a transistor.

2. Description of the Prior Art

FIG. 9 is a block diagram mentioned in Mitsubishi Semiconductor Data Book—1984 on pages 6-7 indicating a prior art control device for a three-terminal controllable electric valve. Referring to the drawing, reference numeral 21 denotes a power transformer, 22 a rectifier circuit formed of a diode bridge, 23 and 24 smoothing capacitors, 25 a driving circuit, and 26 a transistor as a three-terminal controllable electric valve.

The transformer 21 includes a primary winding connected to a commercial power source (not shown) and a secondary winding connected to the rectifier circuit 22. An output current from the secondary winding is rectified by the rectifier circuit 22 and smoothed by means of the capacitors 23, 24, and then supplied to the driving circuit 25. The driving circuit 25 supplies a signal for driving the transistor 26 to the base electrode of the transistor when an ON signal from outside is applied thereto.

A serious problem involved in the control device of the above-mentioned structure is that a relatively large transformer 21 and rectifier circuit 22 are required for providing the driving circuit 25 with a necessary current for its operation. Further, to ensure a stable operation of the transistor 26 which operates under a high voltage, the transistor 26 must be isolated from the transformer 21 handling high voltages. As another problem, there was a danger of surge voltages generated due to switching of the controllable electric valve 26 to mix into other control devices as noises through the circuit of the mentioned transformer or the like. Although it was proposed to provide a snubber device to cope with the surge generation, this caused another problem, namely that the electric power loss would increase accordingly.

SUMMARY OF THE INVENTION

A primary object of the present invention is the provision of a power supply unit for drive control of a three-terminal controllable electric valve, which does not require a special arrangement for voltage resisting treatment for the controllable electric valve and can be provided in a simple structure and small in size at a low cost.

The power supply unit for drive control of a three-terminal controllable electric valve according to the present invention to be connected between positive and negative lines which provide a direct current for the controllable electric valve, comprises a capacitor which is charged with electric energy during the OFF period of the controllable electric valve and discharges the electric energy during the ON period and a driving circuit responding to a control input from outside provides the controllable electric valve with a control current produced from the electric energy discharged from the capacitor through a transformer.

More specifically, the capacitor is charged during the OFF period of the controllable electric valve and discharges the electric energy during the OFF period through the transformer to supply an electric current to the driving circuit so that the driving circuit is operated using the current as its power for driving the controllable electric valve in response to a control input from outside.

BRIEF DESCRIPTION OF THE DRAWINGS

FIGS. 3 -8 are circuit diagrams showing various control devices according to the present invention.

DETAILED DESCRIPTION OF THE PREFERRED EMBODIMENTS

Figure 1:
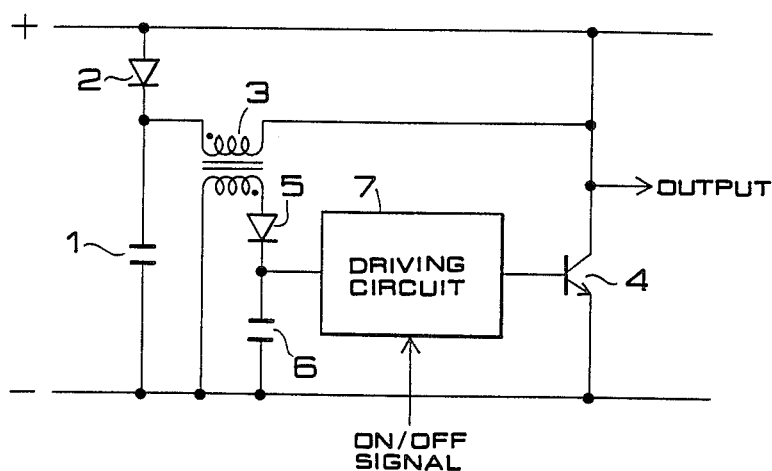
FIG. 1 is a circuit diagram showing a control device for a three-terminal controllable electric valve according to the present invention.

A preferred embodiment of the present invention will be described with reference to the accompanying drawings. Referring to FIG. 1, a first capacitor 1 is connected in series with a diode 2 for reverse-current blocking and this circuit element of series connection is connected between positive and negative lines for a three-terminal controllable electric valve (hereinafter referred to as an "electric valve") 4. Reference numeral 3 denotes a transformer having a primary winding connected between a junction of the diode 2 with the first capacitor 1 and the positive line and a secondary winding directly connected at its one end to the negative line and at the other end through a diode 5 and a second capacitor 6 to the negative line. Reference numeral 7 depicts a driving circuit, connected at its input terminal to a junction of the diode 5 and a second capacitor 6 and at its output terminal to the base electrode of the transistor as the electric valve 4. The driving circuit 7 is adapted to be supplied with ON/OFF signal as a control signal from an exterior circuit (not shown) which is isolated by, for example, a photocoupler.

Operation of the above-described control device will be explained with reference to the waveform diagrams of FIG. 2.

Assuming that the electric valve 4 is in an OFF state, the first capacitor 1 is, from the time when the value 4 is turned off, charged with electricity due to the voltage [indicated in FIG. 2(a)]applied between the positive and negative lines through the diode 2. The first capacitor 1 also serves to absorb the surge voltages which will be produced upon the turning off of the electric valve 4. The electric charge is discharged from the first capacitor 1 through the primary winding of the transformer 3 and the electric valve 4 upon the turning on of the electric valve 4 in response to an ON signal input to the driving circuit 7, and the discharging current induces a current in the secondary winding of the transformer 3. The secondary current is used to charge the second capacitor through the diode 5 and is also supplied to the driving circuit 7. The driving circuit 7 performs ON/OFF control of the electric valve 4 with the mentioned current used as its power. Thus, it is adapted such that the electric power charged on the first capacitor 1 during the OFF period of the electric valve 4 is used for enabling the driving circuit 7 to perform the ON/OFF control of the electric valve 4.

Figure 2:
FIGS. 2(a), 2(b), 2(c), and 2(d) are a waveform ciagram showing various waveforms in the device of FIG. 1.
Figure 2:
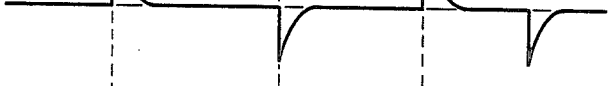
Figure 2:
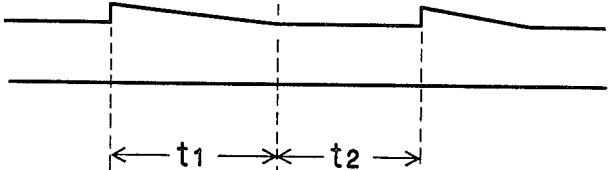
Figure 2:
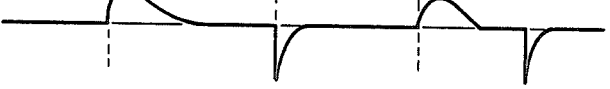

FIG. 2 is a diagram showing voltage and current waveforms at each point in the circuit of FIG. 1. FIG. 2(a) indicates the waveform of the voltage between the positive and negative lines, FIG. 2(b) shows that of the charging current to the first capacitor 1, and FIG. 2(c) indicates that of the voltage between the terminals of the second capacitor 6. As apparent from the waveform diagram, the terminal voltage of the second capacitor 6 slightly rises at the time when the electric valve 4 is turned on due to the discharging current from the first capacitor 1 and then gradually falls as the electric energy is supplied to the electric valve 4.

FIG. 3 is a circuit diagram showing another embodiment of the invention. In this example, an arm in which the first capacitor 1 and the primary winding of the transformer 3 are connected in series is connected between the positive and negative lines, whereby the same functions and effects as in the above described embodiment are obtained without a high grade insulation means between the primary and the secondary windings of the transformer 3.

In still another embodiment as shown in FIG. 4, the diode 2 is connected across the primary winding 3a of the transformer 3 as shown in FIG. 3. In this example, since one end of each of the primary and secondary windings of the transformer 3 is connected to the negative line, a high grade insulation means therebetween can be omitted. The same advantage can be obtained when an autotransformer is used for the transformer 3.

A circuit indicated in FIG. 5 has the same configuration at that shown in FIG. 4 except that a high resistor 8 is connected between one end of the capacitor 6 and the anode line. The second capacitor 6 is charged by a current supplied through the high resistor 8. A voltage limiting device 9 such as a resistor or a zener diode is connected in parallel with the second capacitor 6, whereby a necessary voltage is applied to the driving circuit 7.

Figure 6:
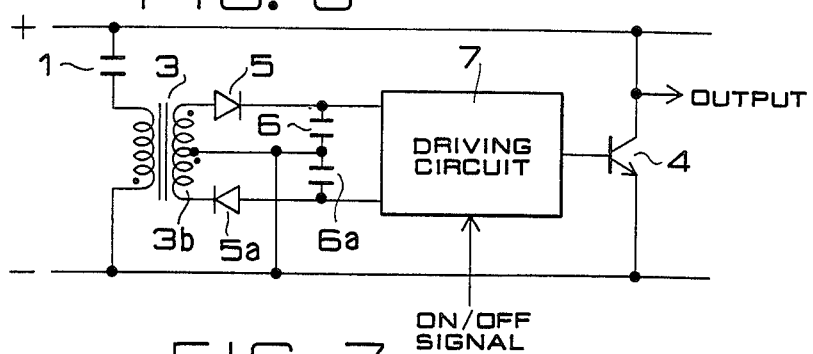

FIG. 6 indicates an example in which both positive and negative voltages are required by the driving circuit 7 from the power source. The secondary winding depicted at 3b of the transformer 3 is formed of two portions connected together at a center tap and its portion on the negative side is connected to a diode 5a and a second capacitor 6a.

Figure 7:
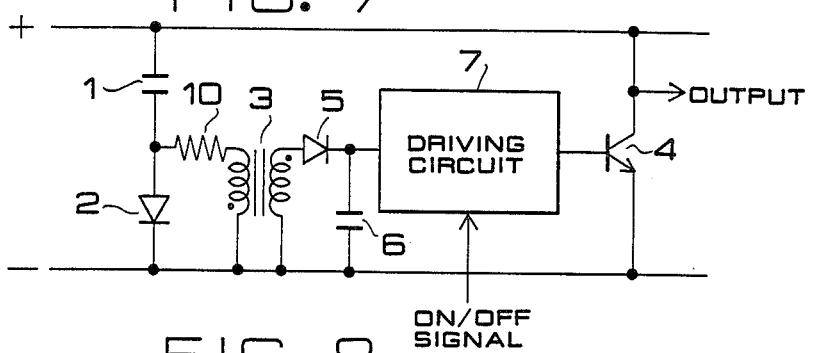

A circuit shown in FIG. 7 is provided with means for limiting the discharging current from the first capacitor 1. That is, a resistor 10 is connected between the diode 2 and the primary winding. In case that the transformer 3 is designed to have an electric characteristic defined by the integrated voltage value over a predetermined time period is set at the required minimum value for the driving circuit 7, a large current over the set value can be prevented from flowing to the second capacitor 6 when the terminal voltage of the second capacitor 6 is low due to its discharging. The waveform of the discharging current of the first capacitor 1 is indicated in FIG. 2(d).

Figure 8:
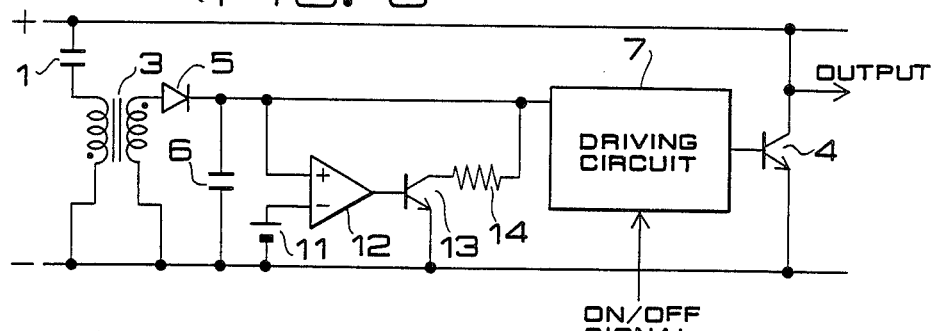
Figure 9:
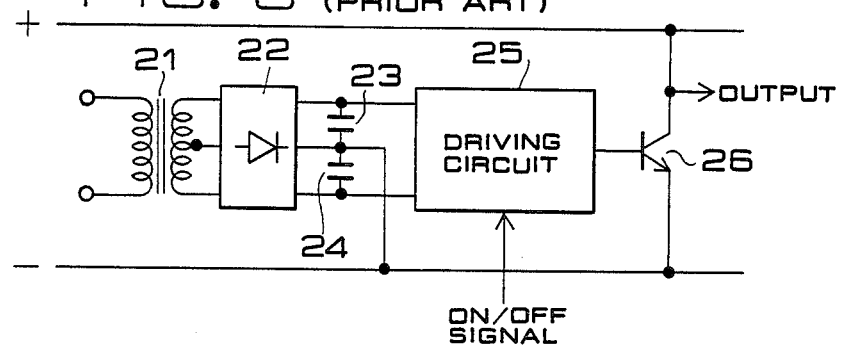
FIG. 9 is a circuit diagram showing a prior art control device.

In FIG. 8 is shown a further embodiment in which means for stabilizing the voltage to be applied to the driving circuit 7 is provided. The voltage stabilizing circuit comprises a comparator 12, a transistor 13 whose base is connected to the output end of the comparator 12, and a resistor 14 connected between the collector electrode of the transistor 13 and the input terminal of the driving circuit 7, the emitter of the transistor 13 being connected to the negative line. One input terminal of the comparator 12 is connected to the junction of the diode 5 and the capacitor 6, namely, the input terminal of the driving circuit 7, and the other input terminal is connected to a reference voltage supply 11. In the described arrangement, when the secondary voltage of the transformer 3 exceeds the reference voltage, it is adapted such that the resistor 14 is inserted in parallel with the secondary circuit and the input voltage of the driving circuit 7 is thereby stabilized. A resistor of a previously calculated resistance value may be connected at the input end of the driving circuit 7 so as to stabilize the input voltage.

In the control device of the present invention, as described above, the electric power required for operating the driving circuit is adapted to be supplied from the capacitor which is charged with the power from the main power source for the three-terminal controllable electric valve during the OFF period of the electric valve. Therefore, there is no need for supplying the power for the driving circuit from outside, and hence, the problem of insulation for the power supply circuit is solved. Furthermore, the surge caused by switching of the controllable electric valve can not be transmitted to another other control circuits through the power supply circuit.

What is claimed is:

1. A device for controlling a three-terminal controllable electric valve connected between positive and negative lines comprising:
    a driving circuit for supplying a driving signal to a control terminal of said controllable electric valve in response to an ON signal from outside; and
    means for supplying to said driving circuit an electric current necessary for its operation making use of an electric current delivered from said positive and negative lines, which includes:
    (a) a transformer incuding a primary winding and a secondary winding, a first end of said secondary winding being connected to said negative line;
    (b) a first capacitor connected between said positive and negative lines for storing electric charge while said controllable electric valve is in a non-conductive state and for conducting its discharging current through said primary winding of said transformer when said controllable electric valve is brought into a conductive state; and
    (c) a second capacitor having an end connected to a second end of said secondary winding of said transformer to be charged with an electric current induced in said secondary winding;
    the input terminal of said driving circuit being connected with a junction of said secondary winding of said transformer and said second capacitor.

2. A device according to claim 1, which further comprises a diode connected between one terminal of said first capacitor and said positive line, wherein a first end of said prmary winding of said transformer is connected to a junction of said first capacitor and said diode and a second end is connected to said positive line.

3. A device according to claim 1, which further comprises a diode connected between said second end of said secondary winding and said second capacitor, wherein a junction of this diode and said second capacitor is connected to the input terminal of said driving circuit.

4. A device according to claim 1, wherein a first end of said primary winding is connected to said negative line and a second end is connected through said first capacitor to said positive line.

5. A device according to claim 4, which further comprises a diode connected between said negative line and a junction of said primary winding and said first capacitor.

6. A device according to claim 1, wherein said first capacitor is connected between a first end of said primary winding and said positive line and a second end of said primary winding is connected to said negative line.

7. A device according to claim 6, which further comprises a diode connected across said primary winding.

8. A device according to claim 6, which further comprises a voltage limiting device connected across said second capacitor.

9. A device according to claim 6, which further comprises a voltage limiting resistor connected between said first capacitor and said first end of said primary winding.

10. A device according to claim 6, which further comprises means for regulating the voltage applied to said driving circuit.

11. A device according to claim 10, wherein said voltage regulating circuit includes a comparator for delivering an output when the voltage at the input terminal of said driving circuit is higher than a reference voltage and a switching device operating such that a predetermined resistance is connected between the input terminal of said driving circuit and said negative line only when the same is applied to the output of said comparator.

12. A device for controlling a three-terminal controllable electric valve connected between positive and negative lines, comprising:

a driving circuit for supplying a driving signal to a control terminal of said controllable eletric valve in respose to an ON signal from outside; and means for supplying to said driving circuit an electric current necessary for its operation making use of an electric current delivered from said positive and negative lines, which includes:

(a) a transformer including a primary winding and a secondary winding provided with a center tap, a first end of said primary winding and the center tap of said secondary winding being connected to said negative line;

(b) a first capacitor connected between a second end of said primary winding and said positive line for storing electric charge while said controllable electric valve is in a nonconductive state and conducting its discharging current through said primary winding of said transformer when said controllable electric valve is brought into a conductive state; and (c) a second capacitor connected between said center tap and a first end of said secondary winding and a third capacitor connected between said center tap and a second end of said secondary winding, said second and third capacitors to be charged with an electric current induced in said secondary winding;

said first and second ends of said secondary winding being connected with input terminals of said driving circuit.

13. A device according to claim 12, which further comprises diodes connected between both ends of said secondary winding and said second capacitors, respectively.

* * * * *

UNITED STATES PATENT AND TRADEMARK OFFICE
CERTIFICATE OF CORRECTION

PATENT NO. : 4,710,696

DATED : December 1, 1987

INVENTOR(S) : Fumio Mizohata et al.

It is certified that error appears in the above-identified patent and that said Letters Patent is hereby corrected as shown below:

Column 4, line 23, delete "another";

line 56, "prmary" should be --primary--.

Signed and Sealed this

Second Day of August, 1988

Attest:

DONALD J. QUIGG

Attesting Officer

Commissioner of Patents and Trademarks